(12) United States Patent
Endo et al.

(10) Patent No.: US 8,058,693 B2
(45) Date of Patent: Nov. 15, 2011

(54) SEMICONDUCTOR DEVICE HAVING SWITCHING ELEMENT AND METHOD FOR FABRICATING SEMICONDUCTOR DEVICE HAVING SWITCHING ELEMENT

(75) Inventors: Koichi Endo, Tokyo (JP); Masaru Izumisawa, Hyogo-ken (JP); Takuma Hara, Kanagawa-ken (JP); Syotaro Ono, Kanagawa-ken (JP); Yoshiro Baba, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 12/641,831

(22) Filed: Dec. 18, 2009

(65) Prior Publication Data

US 2010/0187598 A1 Jul. 29, 2010

(30) Foreign Application Priority Data

Dec. 18, 2008 (JP) ................. P2008-322703

(51) Int. Cl.
*H01L 21/70* (2006.01)
*H01L 21/336* (2006.01)

(52) U.S. Cl. ........................ 257/376; 438/282

(58) Field of Classification Search .......... 257/372–376, 257/349, 386; 438/282, 298
See application file for complete search history.

(56) References Cited

U.S. PATENT DOCUMENTS

| | | | | |
|---|---|---|---|---|
| 5,243,205 A | * | 9/1993 | Kitagawa et al. | 257/173 |
| 6,031,276 A | | 2/2000 | Osawa et al. | |
| 6,972,459 B2 | * | 12/2005 | Miura et al. | 257/335 |

FOREIGN PATENT DOCUMENTS

| | | |
|---|---|---|
| JP | 64-019771 A | 1/1989 |
| JP | 2963204 B2 | 8/1999 |
| JP | 2002-368214 A | 12/2002 |

\* cited by examiner

*Primary Examiner* — Calvin Lee
(74) *Attorney, Agent, or Firm* — Patterson & Sheridan, LLP

(57) ABSTRACT

There is provided a semiconductor device having a switching element, including a first semiconductor layer including a first, second and third surfaces, a first electrode connected to the first semiconductor layer, a plurality of second semiconductor layers selectively configured on the first surface, a third semiconductor layer configured on the second semiconductor layer, a second electrode configured to be contacted with the second semiconductor layer and the third semiconductor layer, a gate electrode formed over the first semiconductor layer, a first region including a first tale region, a density distribution of crystalline defects being gradually increased therein, a peak region crossing a current path applying to a forward direction in a p-n junction, a second tale region continued from the peak region, and a second region including a third tale region, the density distribution of the crystalline defects being gradually increased therein.

6 Claims, 6 Drawing Sheets

SEMICONDUCTOR DEVICE HAVING SWITCHING ELEMENT AND METHOD FOR FABRICATING SEMICONDUCTOR DEVICE HAVING SWITCHING ELEMENT

CROSS REFERENCE TO RELATED APPLICATION

This application is based upon and claims the benefit of priority from the prior Japanese Patent Application No. JP2008-322703, filed Dec. 18, 2008; the entire contents of which are incorporated herein by reference.

FIELD OF THE INVENTION

The present invention relates to a semiconductor device having a switching element and a method for fabricating the semiconductor device, and more particularly, the semiconductor device having a switching element improving characteristics by controlling a carrier lifetime and the method for fabricating the semiconductor device.

DESCRIPTION OF THE BACKGROUND

An MOSFET (Metal Oxide Semiconductor Field Effect Transistor), an IGBT (Insulated Gate Bipolar Transistor) or the like, for example, has been used as a power semiconductor device. With higher voltage and larger current, higher speed of switching has often been demanded on the power semiconductor device.

A parasitic diode is built in the MOSFET. When an n-channel type MOSFET is used, for example, as a DC-DC converter having an inductance load, an inverter or the like, the parasitic diode is used for a turning current by applying a current to forward direction.

Technology controlling a carrier life time in an n-type drift layer to be shorter by irradiating charged particles such as electron, $H^+$, $He^{2+}$ or the like has been known for improvement reverse recovery characteristics of the parasitic diode.

Electrons and holes carried into the n-type drift layer in the n-channel type MOSFET is caused by a bipolar action due to a forward current in the parasitic diode. When crystalline defects as recombination centers by irradiating charged particles such as electron or the like, a recombination lifetime is shortened to improve the reverse recovery characteristics.

As a gate electrode of the IGBT is applied to a minas voltage compared to an emitter electrode in a case of turn-off, electrons carried from an $n^+$-type emitter layer are stopped. On the other hand, electrons are leaved in an n-type drift layer, which is called an n-type base layer, and a large portion of holes is carried out to the emitter electrode. However, a part of the holes are leaved in the n-type drift layer. As the residual electrons and holes are diminished by the recombination, the carrier lifetime can be controlled to be shorter by irradiating $H^+$, $He^{2+}$ or the like other than electron. Hereafter, proton, deuteron, helium ion or the like which is an ion with atomic number being one or two, is described as a light ion.

A relationship between the recombination center and the crystalline defect is mentioned below. In a semiconductor material having a large band gap such as silicon, a recombination is caused through the recombination center. Generating a recombination center near a center of the band gap is an ideal method for effectively driving the recombination process between electrons and holes. It has been well-known that the crystalline defects are intentionally induced by irradiating the light ion or the like so as to introduce the recombination centers in near center of the band gap.

A method mentioned below is disclosed in Japanese Patent No. 2963204, for example, as forming the crystalline defects. A metal absorber, for example, aluminum or the like is configured on a surface of a collector electrode in a back surface of an IGBT and a mask, for example, a stainless-steel or the like having an opening is configured in a surface of the IGBT. A light ion, for example, helium or the like is irradiated through the mask. A light ion particles through a fine opening in the mask are set in a position of a projected rage in $n^-$-base layer by determining acceleration energy and a thickness of the absorber.

The characteristics of the IGBT disclosed in Japanese Patent No. 2963204 are irradiated with the light ions by using the mask are improved as compared to a sample irradiated without a mask. However, as the absorber is 30 μm and the mask is 50 μm thick to the acceleration energy being 20 MeV, a radius of the mask opening is 140 μm or the like.

Problems with difficulty are generated, for example, further miniaturization of the opening and increasing position accuracy in plane. In other word, the conventional method includes a difficult problem, for example, a selective irradiation cannot be performed. In the conventional method, the light ions can be irradiated both in a region being necessary with controlling the carrier life time and in another region being unnecessary for retaining breakdown voltage.

SUMMARY OF THE INVENTION

According to an aspect of the invention, there is provided a semiconductor device having a switching element, including, a first semiconductor layer with a first conductive type, the first semiconductor layer including a first surface, a second surface opposed to and in parallel to the first surface, and a third surface arranged between the first and the second surfaces, a first electrode configured at a side of the second surface and electrically connected to the first semiconductor layer, a plurality of second semiconductor layers selectively configured on a surface region of the first surface, each second semiconductor layer having a second conductive type, a third semiconductor layer with the first conductive type selectively configured on a surface region of the second semiconductor layer, a second electrode configured to be contacted with a surface of the second semiconductor layer and a surface of the third semiconductor layer, a gate electrode formed over the first semiconductor layer via a gate insulator, a first region extended to a direction along the first surface, the first region formed perpendicularly to the first surface including a first tale region, a peak region and a second tale region, wherein a density distribution of crystalline defects in the first region gradually increases, the peak region formed in the first semiconductor layer crosses a current path applying to a forward direction in a p-n junction between the first semiconductor layer and the second semiconductor layer, and the density distribution of the crystalline defects in the second tale region gradually decreases, and a second region adjacent to the first region and extended to a direction along the third surface, the second region including a third tale region formed perpendicularly to the third surface, wherein the density distribution of the crystalline defects of the third tale region gradually increases in the second region, and the crystalline defect density in the second region is not over the crystalline defect density of the adjacent first tale region.

Further, another aspect of the invention, there is provided, a semiconductor device having a switching element, including, a power switching element, including, a first semiconductor layer with a first conductive type formed over a body via an insulator, a first electrode electrically connected to a second semiconductor layer with a second conductive type selectively configured in a surface region of the first semiconductor layer, the second semiconductor layer forming a p-n junction with the first semiconductor layer, a third semiconductor layer with the second conductive type selectively configured in the surface region of the first semiconductor layer, the third semiconductor layer being apart from the second semiconductor layer, a fourth semiconductor layer with the first conductive type selectively formed in a surface of the third semiconductor layer, a second electrode formed to be contacted with the surface of the third semiconductor layer and a surface of the fourth semiconductor layer, and a gate electrode formed over the third semiconductor layer via a gate insulator, a first region selectively extended to a direction along a surface of the first semiconductor layer, the first region including a first tale region, a peak region and a second peak region, wherein a density distribution of crystalline defects in the first region gradually increases, the peak region is formed in a current path applying to a forward direction in a p-n junction between the first semiconductor layer and the second semiconductor layer or in a portion near the current path, and the density distribution of the crystalline defects in the second tale region gradually decreases, and a second region adjacent to the first region and extended to the direction along the surface of the first semiconductor layer, the second region including a third tale region, wherein the density distribution of the crystalline defects in the third tale region gradually increases and is not over the crystalline defect density in the first region.

Further, another aspect of the invention, there is provided, a method for fabricating a semiconductor device having a switching element, including, forming a convex portion at a first length from a surface of a first semiconductor layer in a plane periphery portion of a region being a power switching element in the first semiconductor layer with a first conductive type formed on a semiconductor substrate with the first conductive type, selectively forming a second semiconductor layer with a second conductive type in the surface of the first semiconductor layer to form a p-n junction, and irradiating light ions from the surface of the first semiconductor layer at a second length to generate a peak region of a density distribution of crystalline defects in a current path applying to a forward direction in the p-n junction of the power switching element or a portion near the current path, wherein the second length from a back surface is shorter than the first depth in the first semiconductor layer constituting the p-n junction.

DETAILED DESCRIPTION OF THE INVENTION

Figure 1:
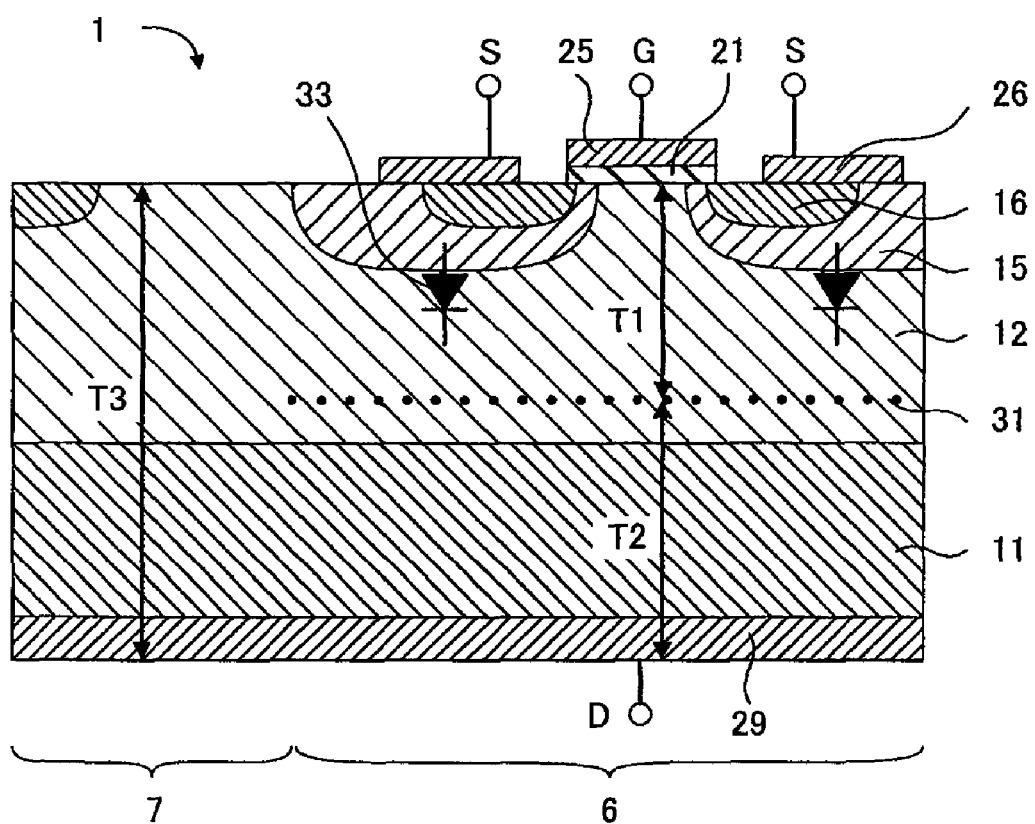
FIG. 1 is a schematic diagram showing a structure of a semiconductor device having a switching element according to a first embodiment of the present invention.

Embodiments of the present invention will be described below in detail with reference to the attached drawings. It should be noted that the present invention is not restricted to the embodiments but covers their equivalents. Throughout the attached drawings, similar or same reference numerals show similar, equivalent or same components.

First Embodiment

First, a semiconductor device having a switching element according to a first embodiment of the present invention will be described below in detail with reference to FIGS. 1-3.

Figure 2A:
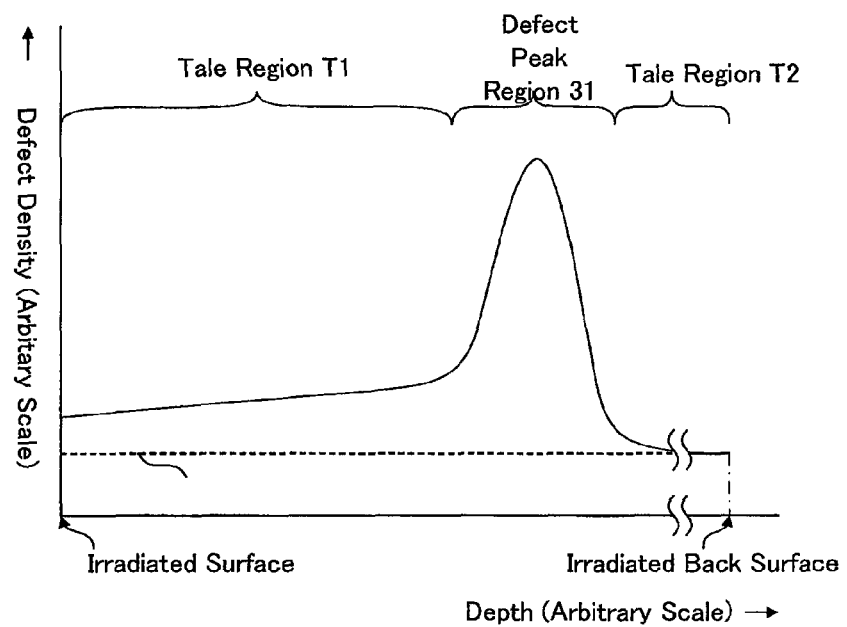
FIG. 2A is a schematic diagram showing a distribution of a crystalline defect density of a lifetime control region in the semiconductor device having the switching element according to the first embodiment of the present invention.
Figure 2B:
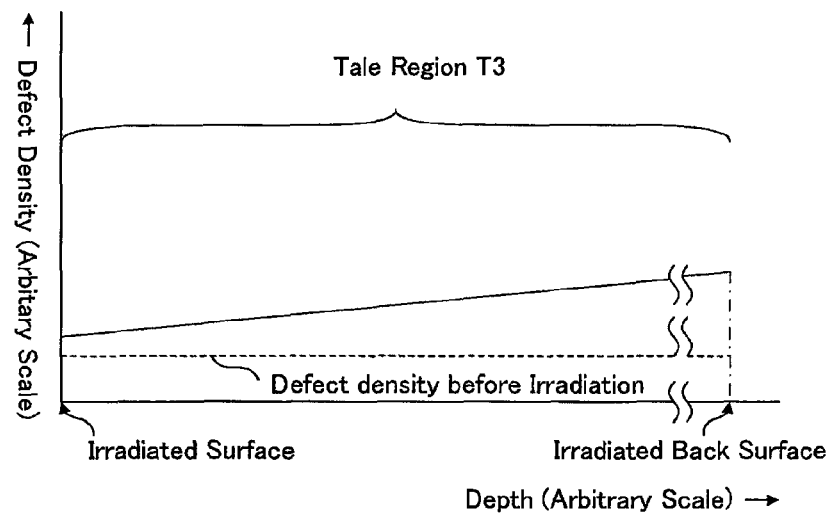
FIG. 2B is a schematic diagram showing a distribution of the crystalline defect density of a lifetime non-control region in the semiconductor device having the switching element according to the first embodiment of the present invention.

FIG. 1 is a schematic diagram showing a structure of the semiconductor device having the switching element according to the first embodiment of the present invention. FIG. 2A is a schematic diagram showing a distribution of a crystalline defect density of a lifetime control region in the semiconductor device having the switching element according to the first embodiment of the present invention. FIG. 2B is a schematic diagram showing a distribution of the crystalline defect density of a lifetime non-control region in the semiconductor device having the switching element according to the first embodiment of the present invention. FIG. 3 is a cross-sectional diagram showing fabricating processes of the semiconductor device having the switching element according to the first embodiment of the present invention.

As shown in FIG. 1, semiconductor device 1 includes an n-channel type MOSFET having an n-type drift layer 12, a drain electrode 29, p-type base layers 15, $n^+$-source layers 16, source electrodes 26 and a gate electrode 25. The n-type drift layer 12 is a first semiconductor layer with a first conductive-type. The drain electrode 29 is a first electrode which is electrically connected to a back surface of the n-type drift layer 12 via an $n^+$-drain layer 11, the back surface being a second surface of the n-type drift layer 12. The p-type base layers 15 are a plurality of second semiconductor layers with a second conductive-type which are selectively configured in a surface region being a first surface of the n-type drift layer 12. Each of the $n^+$-source layers 16 is a third semiconductor layer which is selectively configured in a surface of each of the p-type base layers 15. Each of the source electrodes 26 is a second electrode which is configured to contact with surfaces of the p-type base layer 15 and the n+source layer 16. The gate electrode 25 is configured on the n-type drift layer 12 between the adjacent p-type base layers 15 via the gate insulator 21.

Furthermore, the semiconductor device 1 selectively includes a peak region of a distribution density of the crystalline defects in the n-type drift layer 12 configured under the p-type base layer 15 and the gate insulator 21. The peak region is positioned near the back surface. Hereafter, the peak region is called a defect peak region 31 which has a constant width in the depth direction. The defect peak region 31 may be formed in the n-type drift layer 12 where the semiconductor device 1 is the n-channel type. Here, an insulator, a protective film or the like over the surface of the n-channel type MOSFET is not illustrated.

The defect peak region 31 is configured in parallel to the surface and the back surface of the semiconductor device 1 and is extended in plane. A lifetime control region 6 is defined as a region in which the defect peak region 31 is extended to the surface and the back surface of the semiconductor device 1. A lifetime non-control region 7 is defined as a region in which the defect peak region 31 is not contained as the lifetime control region 6. When the semiconductor device 1 is perpendicularly viewed from the surface, which is a plane view, the semiconductor device 1 is divided into the lifetime control region 6 and the lifetime non-control region 7.

The semiconductor device 1 includes a parasitic diode 33 at a boundary between the p-type base layer 15 and the n-type drift layer 12. When a reverse mode action is performed, a current path applied to a forward direction in the parasitic diode 33 is formed to pass from the source electrode 26 via the p-type base layer 15, the n-type drift layer 12 and the n+ drain layer 11 to the drain electrode 29. Here, the reverse mode action means a reverse transistor action in a case of the drain and the source being reverse each other. The defect peak region 31 is set to be near a p-n junction of the parasitic diode 33 and is configured at the current path when the reverse mode action is operated in the n-type drift layer 12.

As shown in FIG. 2A, a horizontal axis and a vertical axis are arranged as a depth and a crystalline defect density, respectively, the semiconductor device 1 includes a tale region T1 being a first tale region in which crystalline defect density is gradually increased from the surface of the lifetime control region 6, being irradiated with the light ions, to a front side of the defect peak region 31 in the n-type drift layer 12 as shown in FIG. 1. A distribution of the crystalline defect density is transferred from the tale region T1 to the defect peak region 31. The defect peak region 31 has a peak value in a center portion and skirts in which the crystalline defect density is rapidly changed. The crystalline defect density is rapidly decreased. After that, the crystalline defect density has a tale region T2 being a second tale region which is gradually decreased towards the back surface to approach the crystalline defect density before irradiating the light ions as shown by a breaking line in FIG. 2A. Proton is used as the light ion including in another embodiment, however, deuteron, helium ion or the like which is an element ion with an atomic number being one or two can be also used.

The crystalline defect in the tale region T1 at the irradiated surface side is already increased as compared to that before irradiating the light ions and reaches to the defect peak region 31 with accompanying gradual increase. On the other hand, the crystalline defect density in the tale region T2 at the irradiated back surface side has a rapid tilt over the defect peak region 31 as compared to that in the tale region T1 so as to approach a state before irradiating the light ions.

The defect peak region 31 is intensively induced at a position which the light ions 37 are attained. In other word, the position is near a projected range of the light ions 37. The distribution of the crystalline defect density in the tale region T1 and the tale region T2 is known to have tilts as shown in FIG. 2A, respectively.

A depth distribution and a width of the crystalline defect density in the defect peak region 31 are dependent on the light ion species and an acceleration energy, so called an irradiating energy, of the irradiation process. An increasing amount and an increasing ratio of the crystalline defect in the irradiated surface of the tale region T1 to the crystalline defect density before the irradiation is dependent on the irradiating energy of the light ion. The crystalline defect density is nearly proportional to a specific resistance in the semiconductor layer with the same type and the same impurity concentration.

As shown in FIG. 2B, semiconductor device 1 has a tale region T3 being a third tale region in which the crystalline defect is gradually increased before irradiating the light ions in the lifetime non-control region 7 from an irradiated surface to an irradiated back surface. In the irradiated surface, the crystalline defect in the tale region T3 is smaller than that in the tale region T1. The tale region T3 is not attained to the defect peak region. Namely, the projected range of the light ion to crystal silicon is over the back surface of the semiconductor device 1. An increasing amount and an increasing ratio of the crystalline defect in the irradiated surface of the tale region T3 to the crystalline defect before the irradiation is dependent on the irradiating energy of the light ion as the same as the tale region T1.

The distributions of the crystalline defect density as shown in FIGS. 2A and 2B are arranged that the surface of the semiconductor device 1 is the irradiated surface. However, the back surface of the semiconductor device 1 can be arranged as the irradiated surface. In this case, the distribution of the crystalline defect is the same as FIGS. 2A and 2B.

Next, a method for fabricating the semiconductor device 1 is explained. An n-channel type MOSFET, periphery elements and the like in the semiconductor device 1 are fabricated by well-known processes.

Figure 3:
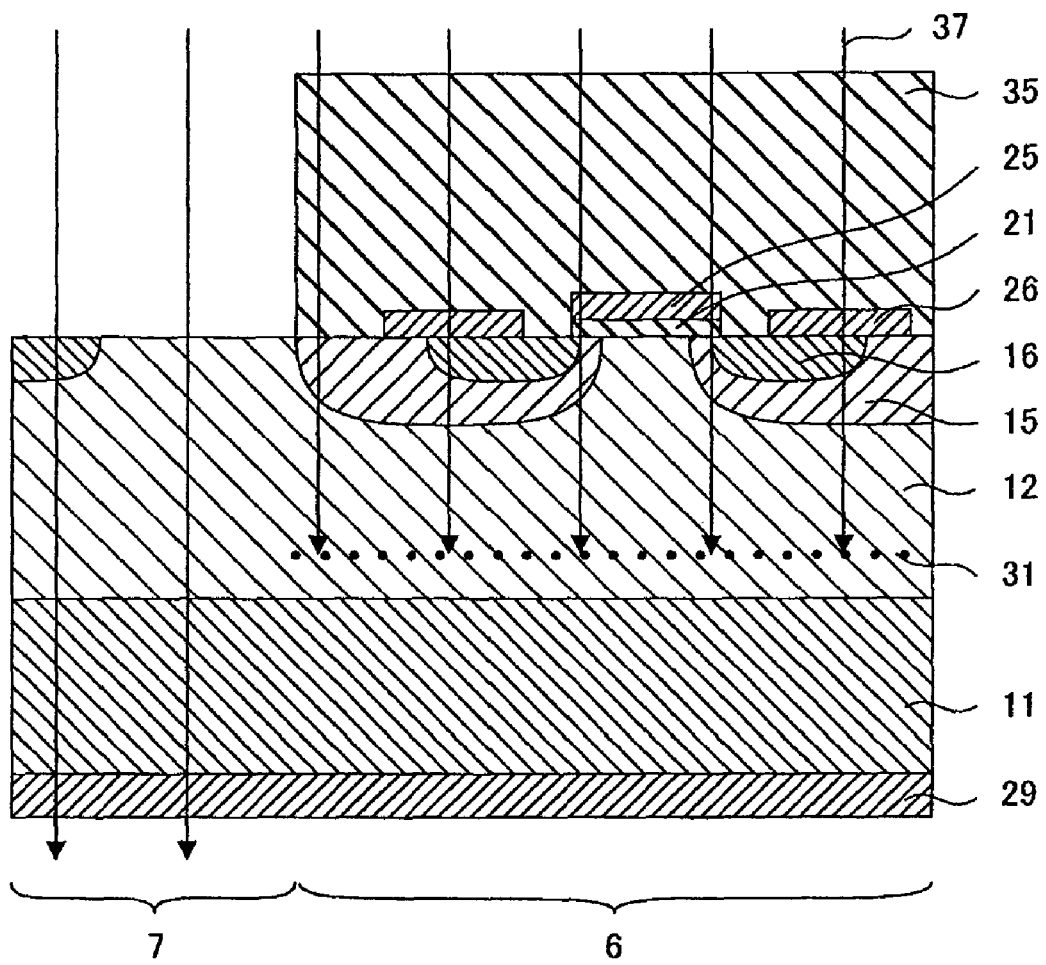
FIG. 3 is a cross-sectional diagram showing fabricating processes of the semiconductor device having the switching element according to the first embodiment of the present invention.

As shown in FIG. 3, a photo-resist, for example, as a deceleration film 35a is leaved to be formed on the irradiated surface of the p-type base layer 15 and the gate insulator 21 by patterning in a photo-lithography process, as the defect peak region 31 is formed under the p-type base layer 15 and the gate insulator 21, and in the n-type drift layer 12. Further, the photo-resist can be leaved as a thinner film than the deceleration film 35 on the surface of the lifetime non-control region 7 at a periphery region of the deceleration film 35.

After that, the light ions 37 are nearly perpendicularly irradiated from an upper side of the deceleration film 35, the n-type drift layer and the like. The defect peak region 31 is formed under the p-type base layer 15 and the gate insulator 21 corresponding to the deceleration film 35 so as to be generated as the lifetime control region 6. The tale region of the distribution of the crystalline defect density is formed on the periphery region of the deceleration film 35 so as to be generated as the lifetime non-control region 7.

As the light ions 37 are irradiated through the deceleration film 35, the irradiating energy of the light ion 37 is decreased to stop the irradiated light ions 37 in the n-type drift layer 12, so that the defect peak region 31 is formed in the lifetime control region 6. On the other hand, as the light ions 37 are directly irradiated into the drift layer 12 without the deceleration film in the lifetime non-control region 7 to penetrate into deeper than the drift layer 12 of the lifetime control region 6. As a result, the light ions 37 go through the back surface of the n$^+$-drain layer 11 to not form the defect peak region 31 in the n-drift layer 12.

The species and the irradiating energy of the light ion, a kind and a thickness of the deceleration film 35 and a thickness of the lifetime non-control region 7 in the irradiating direction being a thickness of the semiconductor device 1 are arranged as mentioned below. The defect peak region 31 is formed at a suitable position in the n-type drift layer 12 of the lifetime control region 6 and is not formed in the lifetime non-control region 7. In the case of using H$^+$ (proton) as the light ion 37, for example, the irradiating energy and the dose amount are nearly several Mev and $1\times10^{11}$-$1\times10^{12}$ cm$^{-2}$, respectively, and the deceleration film 35 is a thin aluminum plate.

The light ions 37 passed through the deceleration film 35 are irradiated into the lifetime control region 6 which includes the distribution of the crystalline defect density as shown in FIG. 2A. The light ions 37 are directly irradiated in the lifetime non-control region 7 which includes the distribution of the crystalline defect density as shown in FIG. 2B. The light ions have the distribution of the crystalline defect density being increased towards the peak value as shown in FIG. 2A.

The deceleration film 35 can be selected from organic insulators or non-organic insulators of a silicon-system, another resin films and metal film, for example, aluminum or the like other than the photo-resist. In a case of non photo-sensitive film, the pattern is etched to be formed by a photo-resist film as a mask in the photo-lithography process, for example. Furthermore, for an effect of decreasing the energy of the light ion 37, a layered film with plural kinds of films, for example, organic insulators or non-organic insulators doped with metal or the like can be selected.

Next, the deceleration film 35 on the surface of the semiconductor device 1 is removed by wet or dry etching technology to complete the semiconductor device 1.

As mentioned above, semiconductor device 1 selectively includes the defect peak region 31 in the p-type base layer 15 and the n-type drift layer 12 formed at the back surface side of the gate insulator 21 in the n-channel type MOSFET having an electrical current path nearly perpendicular to the surface as a vertical type power device. Further, semiconductor device 1 has not the defect peak region corresponding to the defect peak region 31 in a region neighboring to the n-channel type MOSFET. The crystalline defect density at the surface side of the n-channel type MOSFET continues to higher than that of the region neighboring to the n-channel type MOSFET, however, is extremely smaller than that of the defect peak region 31.

As a result, in the n-channel type MOSFET for the power device, the recombination centers are formed at the current path which applies as the forward current in the parasitic diode 33, as shown in FIG. 1. Therefore, the lifetime is shortened so that semiconductor device 1 can act at a higher speed.

Furthermore, the position of the recombination centers in plane in the semiconductor device 1 is determined on a basis of the deceleration film 35 with patterning formed by photo-lithography technique. Consequently, the position of the defect peak region 31 in plane to the p-type base layer 15, namely the position of the recombination centers, can be accurately and repeatedly formed. As a result, the recombination centers are only formed in a region controlling the lifetime and the defect peak region with the recombination centers, however, the recombination centers are not formed in the periphery region in which a breakdown voltage should be retained. Therefore, the breakdown voltage can be prevented from being lower. Especially, a rapid increase of the recombination centers are prevented in a portion of the n-type drift layer 11 near the n$^+$-drain layer 12 neighboring to the n-channel type MOSFET which has probability for lowering the breakdown voltage. Therefore, the breakdown voltage can be controlled.

The embodiment mentioned above is an example as arranging not to form the defect peak region 31 in the lifetime non-control region 7. On the other hand, the defect peak region 31 has a distribution which is totally arranged in the n$^+$-drain layer 11 of the lifetime non-control region 7, for example. In this case, as a region being increased the recombination centers is not configured in the region near the n$^+$-drain layer 11 of the n-type drift layer 12, lowering the breakdown voltage is prevented.

Second Embodiment

Figure 4:
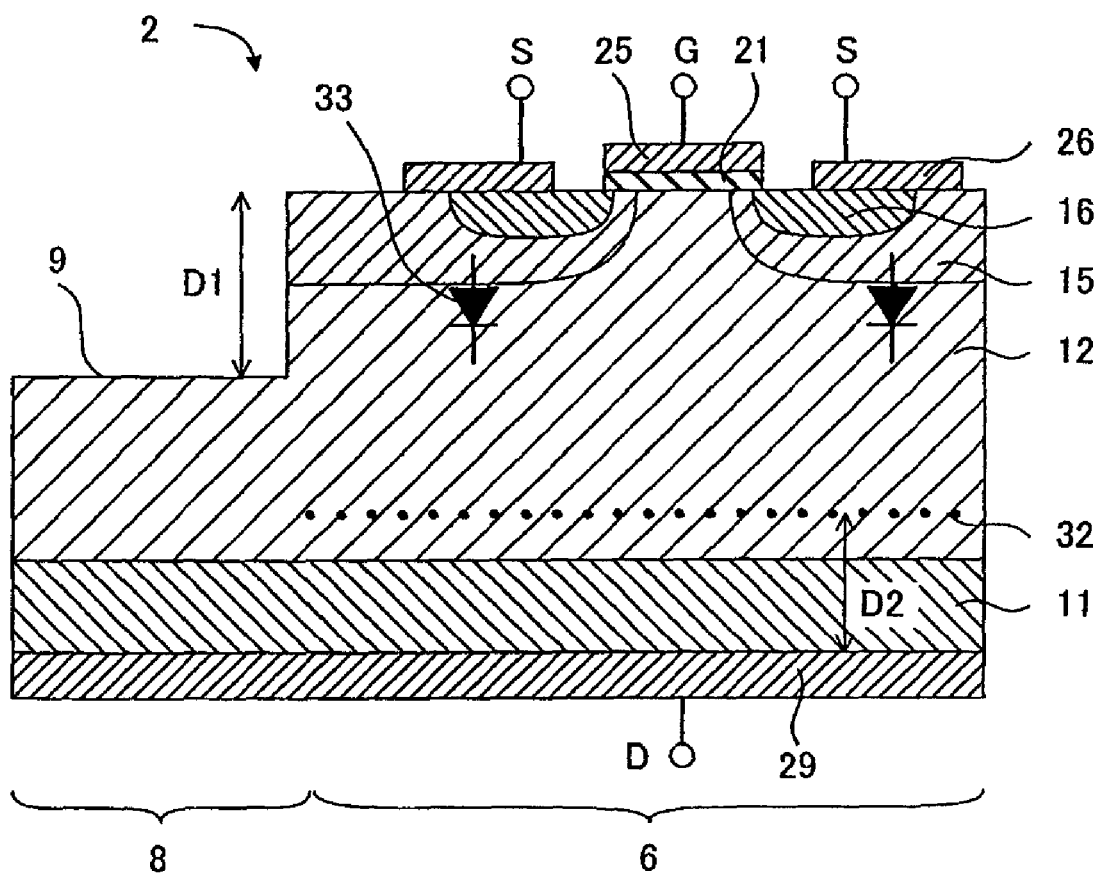
FIG. 4 is a schematic diagram showing a structure of a semiconductor device having a switching element according to a second embodiment of the present invention.
Figure 5:
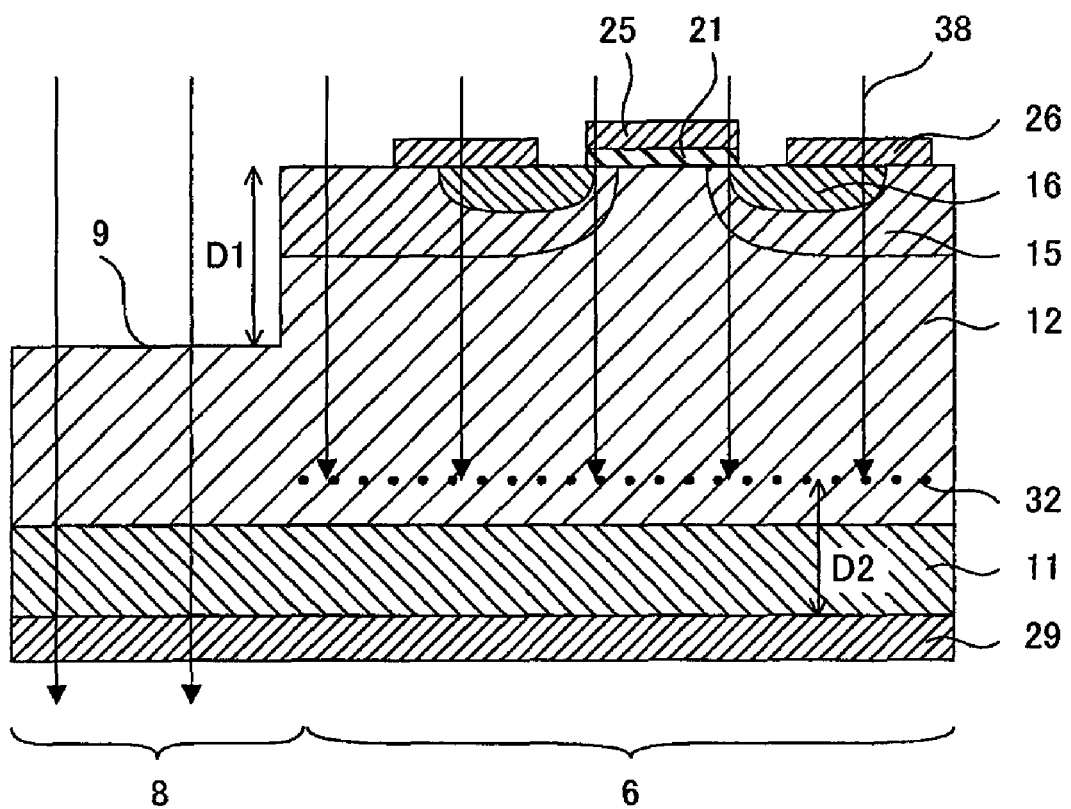
FIG. 5 is a cross-sectional diagram showing fabricating processes of the semiconductor device having the switching element to the second embodiment of the present invention.

Next, a semiconductor device having a switching element according to a second embodiment of the present invention will be described below in detail with reference to FIGS. 4 and 5. FIG. 4 is a schematic diagram showing a structure of the semiconductor device having the switching element according to the second embodiment of the present invention. FIG. 5 is a cross-sectional diagram showing fabricating processes of the semiconductor device having the switching element according to the second embodiment of the present invention. The second embodiment is different from the first embodiment at a point, for example, that the lifetime non-control region is grooved to be a concave portion in the second embodiment while the lifetime non-control region in the first embodiment is a planer type. Throughout the drawings in the second embodiment, similar or same reference numerals in the first embodiment show similar, equivalent or same components. Accordingly, explanations on the components are omitted.

As shown in FIG. 4, a lifetime non-control region 8 corresponding to the lifetime non-control region 7 according to the first embodiment is configured neighboring to the lifetime control region 6 in a semiconductor device 2. The lifetime non-control region 8 is formed to be lowered a distance D1 to the surface of the lifetime control region 6. Consequently, the lifetime non-control region 8 has a concave portion 9 having a surface positioned nearer to a back surface. Constitution of the n-channel type MOSFET for a power device configured in the lifetime control region 6 is the same as that of the vertical n-channel type MOSFET according to the first embodiment.

Next, a method for fabricating the semiconductor device 2 is explained. As shown in FIG. 5, a defect peak region 32 is necessary to be formed in the n-type drift layer 12. Accordingly, a distance D2 between a back surface of the semiconductor substrate 11 in the lifetime control region 6 and a defect peak region 32 (a position of the peak value) is arranged to be smaller than D1 being the depth of the concave portion 9 which is the distance between the surface of the n-type drift layer 12 in the lifetime control region 6 and the surface of the lifetime non-control region 8. A position of the concave portion 9 in plane is determined on a basis of a mask film (not illustrated) by patterning due to photo-lithography technique. The distance D1 is formed by RIE (Reactive Ion Etching), polishing, grinding or the like. The lifetime control region 6 has accuracy in photo-lithography technique. Further, forming the concave portion 9 can be performed either before forming the n-channel type MOSFET or after forming the n-channel type MOSFET.

Next, light ions 38 are nearly perpendicularly irradiated from an upper side into the surfaces of the lifetime control region 6 and lifetime non-control region 8. The defect peak region 32 is formed under the p-type base layer 15 and the gate insulator 21, and in the n-type drift layer 12. The tale region of a distribution of the crystalline defect density is formed in the lifetime non-control region 8.

An irradiating energy of the light ion 38 is smaller than that of the light ion 37 according to the first embodiment, as the deceleration film or the like is not necessary to pass through. The defect peak region 32 in the lifetime control region 6 is formed as the same position as that in the first embodiment, and a defect peak region corresponding to the defect peak region 32 is not formed in the lifetime non-control region 8.

As a result, the semiconductor device 2 has the same effect of the semiconductor device 1 according to the first embodiment. Furthermore, as the semiconductor device 2 has smaller irradiating energy of the light ion 38 than irradiating energy of the light ion 37. Accordingly, the crystalline defect is retained smaller at a region near the $n^+$-drain layer 11 of the n-type drift layer 12 neighboring to the n-channel type MOSFET which may be lowered the breakdown voltage in the lifetime non-control region 8. Therefore, lowering a breakdown voltage can be prevented.

Third Embodiment

Figure 6:
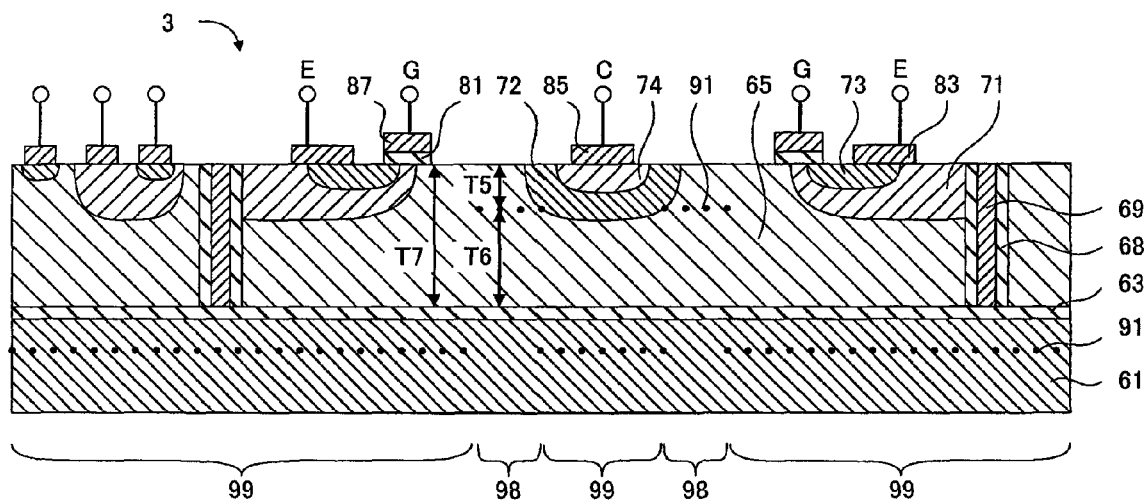
FIG. 6 is a schematic diagram showing a structure of a semiconductor device having a switching element according to a third embodiment of the present invention.
Figure 7:
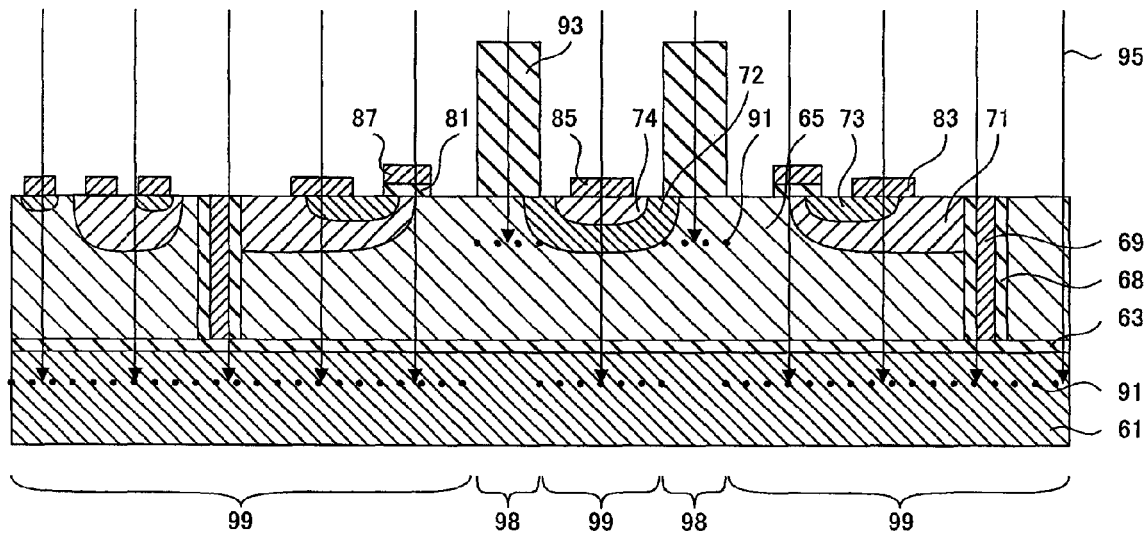
FIG. 7 is a cross-sectional diagram showing fabricating processes of the semiconductor device having the switching element according to the third embodiment of the present invention.

Next, a semiconductor device having a switching element according to a third embodiment of the present invention will be described below in detail with reference to FIGS. 6 and 7. FIG. 6 is a schematic diagram showing a structure of the semiconductor device having the switching element according to the third embodiment of the present invention. FIG. 7 is a cross-sectional diagram showing fabricating processes of the semiconductor device having the switching element according to the third embodiment of the present invention. The third embodiment is different from the first embodiment at a point, for example, that the semiconductor device is a switching element as a power device applied to an integrated circuit on a silicon-on-insulator substrate (SOI). Throughout the drawings in the third embodiment, similar or same reference numerals in the first embodiment show similar, equivalent or same components. Accordingly, explanations on the components are omitted.

As shown in FIG. 6, a semiconductor device 3 is formed on a semiconductor substrate 61 being a body via an embedded insulator 63 being an insulating film and includes an IGBT. The IGBT includes an n-type drift layer 65, a $p^+$-type collector layer 74, a collector electrode 85, a p-type base layer 71, an $n^+$-type emitter electrode 73, an emitter electrode 83 and a gate electrode 87 formed via a gate insulator 81. The collector electrode 85 is a first electrode connected to the n-type drift layer 65 being a first semiconductor layer with a first conductive-type and a $p^+$-type collector layer 74 being a second semiconductor layer with a second conductive-type selectively configured in a surface region of the n-type drift layer 65. The p-type base layer 71 is a third semiconductor layer selectively configured in a surface region of the n-type drift layer 65 and apart from the $p^+$-type collector layer 74. The $n^+$-type emitter electrode 73 is a fourth semiconductor layer selectively configured in a surface region of the p-type base layer 71. The emitter electrode 83 is a second electrode configured to contact with surfaces of the p-type base layer 71 and $n^+$-type emitter electrode 73. The gate electrode 87 is formed via the gate insulator 81 on the p-type base layer 71 between the $n^+$-type emitter electrode 73 and the n-type drift layer 65 which are adjacent each other. Further, an $n^+$-type buffer layer 72 is configured in the n-type drift layer 65 to be contacted with the $p^+$-type collector layer 74, however, the $n^+$-type buffer layer 72 may be not essential.

Furthermore, semiconductor device 3 includes a lifetime control region 98 being a first region which is selectively extended to a direction along a surface of the n-type drift layer 65. The lifetime control region 98 includes a tale region T5 and a tale region T6. The tale region T5 is a first tale region which has a distribution of the crystalline defect density, the crystalline defects being the recombination centers and gradually being increased from the surface of the n-type drift layer 65 to reach a defect peak region 91 which is selectively formed. The defect peak region 91 is formed in a current path applying to a forward direction in a p-n junction between the $p^+$-type collector layer 74 and the $n^+$-type buffer layer 72 in the n-type drift layer 65 or in the n-type drift layer 65 near the p-n junction and the current path. The defect peak region 91 is converted from increasing in the tale region T5 to decreasing in the tale region T6. The tale region T6 is a second tale region which has the distribution of the crystalline defect, the crystalline defect gradually being decreased from the defect peak region 91 to the back surface of the n-type drift layer 65 opposed to the surface of the n-type drift layer 65. The defect peak region 91 cannot be into the p-n junction between the $p^+$-type collector layer 74 and the $n^+$-type buffer layer 72, and the defect peak region 91 may be permitted in the $n^+$-type buffer layer 72.

Furthermore, semiconductor device 3 includes a lifetime non-control region 99 being a second region which is selectively extended to a direction along the surface of the n-type drift layer 65. The lifetime non-control region 99 is neighboring to the lifetime control region 98 and includes a tale region T7 being a second tale region which has the distribution of the crystalline defect density, the crystalline defects being the recombination centers and gradually being increased from the surface of the n-type drift layer 65.

The semiconductor device 3 includes an isolation region which is constituted with an isolation insulator 68 from the surface to the embedded insulator 63 and a embedded polycrystalline silicon 69 embedded between two isolation insulators 68 being adjacent each other. Another device elements or the like are formed an adjacent region to the IGBT separated by the isolation insulator 68.

In the semiconductor device 3, the distributions of the crystalline defect density in the tale regions T5, T6 and T7, and the defect peak region 91 have the same tendencies as the distributions of the crystalline defect density in the tale regions T1, T2 and T3, and the defect peak region 31, respectively.

Next, a method for fabricating the semiconductor device 3 is explained. The IGBT, periphery elements configured in the periphery region and the like in the semiconductor device 3 are fabricated by well-known processes.

As shown in FIG. 7, the photo-resist, for example, as a deceleration film 93 is leaved to be only formed on the surface of the lifetime control region 98 in which the defect peak region 91 has necessary to be formed in the n-type drift layer 65. On the other hand, the photo-resist is not formed on the surface of the lifetime non-control region 99.

Next, light ions 95 are nearly perpendicularly irradiated from an upper side of the deceleration film 93 on the lifetime control region 98 and the lifetime non-control region 99. A species and an irradiating energy of the light ion 95, a kind and a thickness of the deceleration film 93, and a thickness of the n-type drift layer 65 of the lifetime non-control region 99 being a depth of the n-type drift layer 65 to the embedded insulator 63 are arranged as mentioned below. The defect peak region 91 is formed at a suitable position in the n-type drift layer 65 of the lifetime control region 98. The defect peak region 91 is in the semiconductor substrate 61 out of the n-type drift layer 65 in the lifetime non-control region 99. Namely, the suitable position is formed in the $n^+$-type buffer layer 72 under a side portion of the $p^+$-type collector layer 74 and in the n-type drift layer 65. Furthermore, the light ions 95 may go out the back surface of the semiconductor substrate 6 in the lifetime non-control region 99, so that the defect peak region 91 may not be in the semiconductor substrate 61.

As mentioned above, semiconductor device 3 has the defect peak region 91 near the p-n junction between the $p^+$-type collector layer 74 and the $n^+$-type buffer layer 72, in the current path applying to the forward direction in the p-n junction and connecting between the collector electrode 85 and the emitter electrode 83, or near the current path. Furthermore, the semiconductor device 3 includes the tale region T7 in the lifetime non-control region 99 and the defect peak region 91 at the back surface side from the embedded insulator 63.

As a result, the recombination centers are formed in the current path applying in the p-n junction to forward direction in the IGBT to shorten the lifetime, so that the semiconductor device 3 can act at a higher speed. In the horizontal IGBT; the position of the defect peak region 91 in plane is arranged on a basis of the deceleration film 93 patterned by photo-lithography technique, so that the recombination center can be accurately and repeatedly formed. The recombination centers are retained in the lifetime non-control region 99 with lower density in the semiconductor device 3, so that lowering a breakdown voltage or the like in the lifetime non-control region 99 can be suppressed.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, the vertical n-channel MOSFET as the power device are demonstrated in the first embodiment and the second embodiment, and the horizontal IGBT as the power device are demonstrated in the third embodiment, however, another element which has a necessity to shorten and control the lifetime, for example, horizontal or vertical elements, or a diode, for example, can be applied to the first, the second and the third embodiments.

Further, the embodiment are applied to the n-channel type power switching device, however, the embodiment can be also applied to the p-channel type power switching device.

What is claimed is:

1. A semiconductor device having a switching element, comprising:
    a first semiconductor layer with a first conductive type, the first semiconductor layer including a first surface, a second surface opposed to and in parallel to the first surface, and a third surface arranged between the first and the second surfaces;
    a first electrode configured at a side of the second surface and electrically connected to the first semiconductor layer;
    a plurality of second semiconductor layers selectively configured on a surface region of the first surface, each second semiconductor layer having a second conductive type;
    a third semiconductor layer with the first conductive type selectively configured on a surface region of the second semiconductor layer;
    a second electrode configured to be contacted with a surface of the second semiconductor layer and a surface of the third semiconductor layer;
    a gate electrode formed over the first semiconductor layer via a gate insulator;
    a first region extended to a direction along the first surface, the first region formed perpendicularly to the first surface including a first tale region, a peak region and a second tale region, wherein a density distribution of crystalline defects in the first region gradually increases, the peak region formed in the first semiconductor layer crosses a current path applying to a forward direction in a p-n junction between the first semiconductor layer and the second semiconductor layer, and the density distribution of the crystalline defects in the second tale region gradually decreases; and
    a second region adjacent to the first region and extended to a direction along the third surface, the second region including a third tale region formed perpendicularly to the third surface, wherein the density distribution of the crystalline defects in the third tale region gradually increases, and the crystalline defect density in the second region is not over the crystalline defect density of the adjacent first tale region.

2. The semiconductor device having the switching element according to claim 1, wherein
    the crystalline defects are formed by irradiating light ions.

3. The semiconductor device having the switching element according to claim 2, wherein
    the light ion is at least one of ion with atomic number one and ion with atomic number two.

4. A semiconductor device having a switching element, comprising:
    a power switching element, comprising;
    a first semiconductor layer with a first conductive type formed over a body via an insulator;
    a first electrode electrically connected to a second semiconductor layer with a second conductive type selectively configured in a surface region of the first semiconductor layer, the second semiconductor layer forming a p-n junction with the first semiconductor layer;
    a third semiconductor layer with the second conductive type selectively configured in the surface region of the first semiconductor layer, the third semiconductor layer being apart from the second semiconductor layer;
    a fourth semiconductor layer with the first conductive type selectively formed in a surface of the third semiconductor layer;
    a second electrode formed to be contacted with the surface of the third semiconductor layer and a surface of the fourth semiconductor layer; and
    a gate electrode formed over the third semiconductor layer via a gate insulator;
    a first region selectively extended to a direction along a surface of the first semiconductor layer, the first region including a first tale region, a peak region and a second peak region, wherein a density distribution of crystalline defects in the first region gradually increases, the peak region is formed in a current path applying to a forward direction in a p-n junction between the first semiconductor layer and the second semiconductor layer or in a portion near the current path, and the density distribution of the crystalline defects in the second tale region gradually decreases; and
    a second region adjacent to the first region and extended to the direction along the surface of the first semiconductor layer, the second region including a third tale region, wherein the density distribution of the crystalline defects in the third tale region gradually increases and is not over the crystalline defect density in the first region.

5. The semiconductor device having the switching element according to claim 4, wherein
    the crystalline defects are formed by irradiating light ions.

6. The semiconductor device having the switching element according to claim 5, wherein
    the light ion is at least one of ion with atomic number one and ion with atomic number two.

* * * * *